United States Patent [19]
Maemura et al.

[11] Patent Number: 5,163,169
[45] Date of Patent: Nov. 10, 1992

[54] FREQUENCY DIVIDER HAVING THE POWER SUPPLY CONNECTED TO THE GAAS SUBSTRATE

[75] Inventors: Kousei Maemura; Teruyuki Shimura; Hiroaki Seki, all of Itami, Japan

[73] Assignee: Mitsubishi Denki Kabushiki Kaisha, Japan

[21] Appl. No.: 455,134

[22] Filed: Dec. 22, 1989

[30] Foreign Application Priority Data

Dec. 28, 1988 [JP] Japan .................. 63-334347

[51] Int. Cl.[5] .................. H03K 3/01; H01L 29/48
[52] U.S. Cl. .................. 307/296.2; 307/443; 307/491; 307/271; 307/310; 307/303.2; 328/15; 328/25; 257/275; 257/280
[58] Field of Search ............... 307/443, 448, 450-451, 307/491, 271, 310, 296.2, 303.1-303.2, 304, 542; 328/15, 25; 377/47; 357/22 I, 22 F, 15

[56] References Cited

U.S. PATENT DOCUMENTS

| | | | |
|---|---|---|---|
| 4,092,548 | 5/1978 | Beilstein, Jr. et al. | 307/304 |
| 4,627,082 | 12/1986 | Pelgrom et al. | 307/304 |
| 4,717,836 | 1/1988 | Doyle | 307/310 |
| 4,725,813 | 2/1988 | Miyada | 340/347 |
| 4,791,318 | 12/1988 | Lewis et al. | 307/297 |
| 4,864,373 | 9/1989 | Miyashita | 307/296.2 |
| 4,890,011 | 12/1989 | Miyatake | 307/304 |
| 4,985,642 | 1/1991 | Gamand | 307/304 |

OTHER PUBLICATIONS

Das et al., "Low-Frequency...MESFETs", Electronics Letters, Mar. 1982, vol. 18, No. 5, pp. 207–208.
Kaminska et al., "Current Oscillations...Donor EL2", Appl. Phys. Lett. 41(10), Nov. 1982, pp. 989–991.
Makram-Ebeid et al., "The Roles of... Integrated Circuits", IEEE Transactions on Electron Devices, vol. ED-32, No. 3, Mar. 1985, pp. 632–642.
Shimizu et al., "A 1 GHz 50 mW GaAs Dual Modulus Divider IC", IEEE Journal of Solid-State Circuits, Oct. 1984, No. 5.

Primary Examiner—Janice A. Howell
Assistant Examiner—Margaret Rose Wambach
Attorney, Agent, or Firm—Leydig, Voit & Mayer

[57] ABSTRACT

A frequency divider circuit including a field effect transistor on a semi-insulating substrate including applying a voltage higher than the lowest of the power supply voltages of the frequency divider circuit to the semi-insulating substrate.

4 Claims, 10 Drawing Sheets

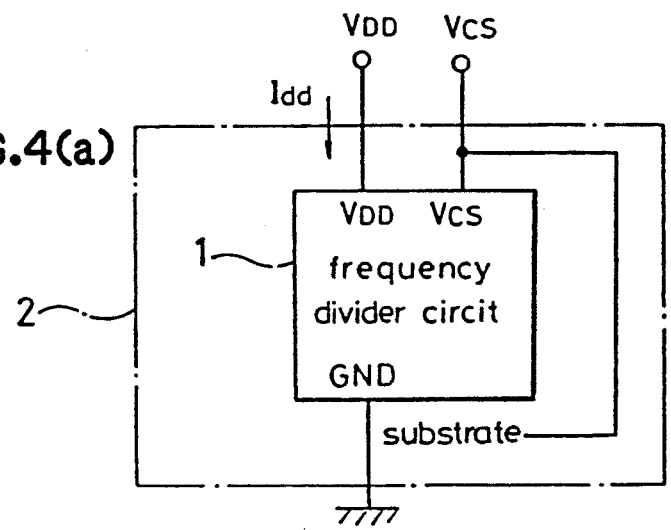

| Vcs | power supply current | circuit operation |
|---|---|---|
| 0 | ≈ 0 mA | no operation |
| 5 | Idd (5mA) | operation |

FREQUENCY DIVIDER HAVING THE POWER SUPPLY CONNECTED TO THE GAAS SUBSTRATE

FIELD OF THE INVENTION

The present invention relates to a semiconductor device and, more particularly, to a frequency divider circuit on a semi-insulating substrate.

BACKGROUND OF THE INVENTION

FIG. 10 shows a wiring arrangement of a conventional frequency divider circuit on a semi-insulating substrate that such as GaAs substrate is sealed in a flat package. FIG. 11 shows a circuit diagram thereof.

The frequency divider circuit of FIG. 10 includes an input terminal P1 for inputting a signal to be frequency divided, a power supply (VDD) terminal P2, a frequency divider output terminal P3, a ground (GND) terminal P4, a current control terminal P5, a reference voltage input terminal P6, package leads L1 to L8, a frame $L\phi$ on which an IC substrate 1 is mounted, and bonding wires W1 to W7 connecting the terminals and the leads with each other. Among these wires, wires W4 and W5 connect the ground terminal P4 and the lead L5 via the frame $L\phi$.

Reference numeral 1 of FIG. 10 designates an IC substrate, and reference numeral 2, represented by dotted line in FIG. 11, designates the package. In FIG. 11, there are provided a power supply voltage terminal $V_{DD}$, a current control terminal $V_{CS}$, an input terminal IN for a signal to be frequency divided, an input reference voltage terminal $V_R$, a ground terminal GND, and an output terminal OUT.

As shown in FIGS. 10 and 11, the ground terminal GND is connected to the frame $L\phi$ of package to stabilize the substrate voltage and circuit operation.

A phase locked loop (hereinafter referred to as "PLL") frequency synthesizer for an automobile telephone using this frequency divider circuit is shown in FIG. 12.

In FIG. 12, a voltage controlled oscillator (hereinafter referred to as "VCO") A1, a frequency divider circuit A2, a reference frequency oscillator A3, a phase comparator A4, and a control circuit A5 of the frequency divider circuit A2 are provided. In the figure, $f_0$ represents the oscillation frequency of the VCO A1, which is an output of the PLL frequency synthesizer, $f_h$ represents the output of the frequency divider circuit A2, $f_r$ represents a reference frequency, and $V_0$ represents the output voltage of the phase comparator A4. In this construction, suppose that the frequency division rate of the frequency divider A2 is n, then $f_h$ is as follows.

$$f_h = f_0/n \quad (1)$$

When the frequency $f_h$ is higher than the frequency $f_r$, the output voltage $V_0$ of the phase comparator A4 is lowered, and when the $V_0$ is thus lowered, that is, the input voltage of the VCO A1 is lowered, $f_0$ is lowered and the following relation is established:

$$f_h = f_r \quad (2)$$

Then, this circuit is stabilized and the output frequency $f_0$ holds a constant value. Accordingly, from the formula (1), the output frequency of the PLL synthesizer, that is, $f_0$ is represented by:

$$f_0 = n \cdot f_h \quad (3)$$

Herein, the frequency division rate n of the frequency divider circuit A2 is variable dependent on the signal supplied from the control circuit A5, and accordingly, the output frequency $f_0$ is also variable.

Furthermore, in order to lower the current consumption of the PLL frequency synthesizer, the operation of the frequency divider circuit may be halted when the circuit is not required for operation of the synthesizer. One way of constructing such a frequency divider circuit is reported in Japanese Published Patent Application 63-294214.

FIG. 13(a) shows a frequency divider circuit having such a halt mode. The $V_{CS}$ terminal in FIG. 11 is a current switching terminal for this halt mode. The frequency divider circuit 1 operates in accordance with the applied voltage as shown in FIG. 13(b).

In such a system, circuits such as a control circuit or a phase comparator which do not have to operate at high frequency are silicon CMOS ICs and the power supply voltage $V_{DD}$ is usually a single 5 V power supply. Accordingly, even in a frequency divider circuit which requires operation at high frequency, the 5 V power supply is used. That is, $V_{DD}$ is 5 V and GND is 0 V in FIG. 11.

This means that the semi-insulating substrate may occasionally be set at 0 V and circuit elements such as an FET or implanted resistor may operate at a voltage close to 4 V as shown in FIG. 16. When the active layer of implantation resistor or FET has a voltage higher than the substrate, the characteristics of the FET or the resistance value of an implanted resistor vary during operation at frequencies from 0 to 5 KHz. The cause thereof is thought to be an electron, hole trapping mechanism (not shown) between the semi-insulating substrate 1 and the active layer 1a as shown in FIG. 16. The mechanism effectively causes electrons and holes to be generated and recombined, changing the voltage applied to the active layer, and modulating the thickness of active layer, as described in greater detail later.

When the characteristics of FET vary or the value of the resistor oscillates in such a frequency divider circuit, the output signal is phase-modulated. When such divider is used in a PLL frequency synthesizer, output signal varies in phase, thereby causing malfunctions such as noise.

The malfunction will be described with reference to FIG. 14. FIG. 14 shows an example of a logic gate including a frequency divider circuit in a source coupled type logic gate.

In FIG. 14, field effect transistors (FET) and $J_1$ and $J_2$ are switches and $J_3$ is a constant current source. The circuit of FIG. 14 also includes load resistors $R_L$, and a reference voltage generator Vr. $V_{DD}$ represents a power supply voltage and GND represents a ground voltage. $I_1$ to $I_3$ designate currents flowing through the FETs $J_1$ to $J_3$, and $V_S$ represents the source voltages of FETs $J_1$ and $J_2$, $V_{IN}$ represents an input voltage, and $V_{01}$ and $V_{02}$ represent output voltages which are inverted with respect to each other.

When the threshold voltage of this logic gate, $V_T$, is the same as the input voltage so that the output signals $V_{01}$ and $V_{02}$ are to equal, the gains of $J_1$ and $J_2$ are K, the threshold voltage is $V_{th}$, the characteristics of the FETs $J_1$ and $J_2$ are equal to each other, and the currents $I_1$ and $I_2$ of the FETs $J_1$ and $J_2$ become:

$$I_1 = K(V_{IN} - V_S - V_{th})^2 \quad (4)$$

$$I_2 = K(V_r - V_S - V_{th})^2 \quad (5)$$

Therefore, when the input voltage $V_{IN}$ is $V_T$, $$I_1 = I_2, \quad (6)$$

and from the formulae (4) and (5), and $$V_T = V_r. \quad (7)$$

Now, if the voltage applied to the active layer is changed by the substrate voltage and the gain K varies by $\Delta K$, the active layer of the FET $J_2$ is modulated and the threshold voltage $V_{th}$ varies by $\Delta V_{th}$, the currents $I_1$ and $I_2$ become $$I_1 = K(V_{IN} - V_S' - V_{th})^2 \quad (8)$$

$$I_2 = (K + \Delta K)\{V_r - V_S' - (V_{th} + \Delta V_{th})\}^2. \quad (9)$$

When $V_{IN} = V_T'$, the threshold voltage of the circuit becomes $V_T'$ and:

$$I_3 = I_1 + I_2 \quad (10)$$

Further, from the formula (6), $$I_1 = I_2 = \frac{I_3}{2}, \quad (11)$$

and from the formula (8), $$K(V_T' - V_S' - V_{th})^2 = \frac{I_3}{2}$$

$$\therefore V_T' = \sqrt{\frac{I_3}{2K}} + V_S' + V_{th}. \quad (12)$$

Furthermore, from the formulae (11) and (9), $$V_S' = -\sqrt{\frac{I_3}{2(K + \Delta K)}} + V_r - (V_{th} + \Delta V_{th}), \quad (13)$$

and from the formula (12), $$V_T' = \sqrt{\frac{I_3}{2}} \left( \frac{1}{\sqrt{K}} - \frac{1}{\sqrt{K + \Delta K}} \right) + V_r - \Delta V_{th}. \quad (14)$$

Thus, the variation $\Delta V_T$ of $V_T$ becomes, $$\Delta V_T = V_T' - V_r$$

$$= \sqrt{\frac{I_3}{2}} \left( \frac{1}{\sqrt{K}} - \frac{1}{\sqrt{K + \Delta K}} \right) - \Delta V_{th}. \quad (15)$$

The threshold voltage $V_T$ thus varies.

The phase modulation due to the variation in the threshold value will be described with reference to FIG. 15. In FIG. 15, $V_{IN}$ designates an input signal, $V_T$ and $V_T'$ designate threshold values of the circuit, and the $\Delta \phi_0$ designates phase deviation due to the change in the threshold value.

As shown in FIG. 15, the threshold value $V_T$ changes to $V_T'$, and the phase information unfavourably varies by $\Delta \phi_0$.

Thus, when a phase modulation of $\Delta \phi_0$ arises in the output signal in the frequency divider circuit, suppose that the frequency division rate of the frequency divider circuit is n, the total phase error $\Delta \phi$ in the PLL frequency synthesizer becomes, $$\Delta \phi = n \cdot \Delta \phi_0. \quad (16)$$

The phase modulation arises in the frequency divider circuit when the frequency divider circuit is operated at an ambient temperature above 60° C. The modulation of the output signal is also low, below −60 dB, and has caused no problem in conventional devices.

As described above, in the conventional frequency divider circuit produced on a semiconductor substrate, since 0 V is applied to the substrate even when the frequency divider circuit is operated at a power supply voltage of 5 V, oscillation between the internal element and substrate occurs due to a so called back gate effect, phase modulating in the output of the frequency divider circuit. This effect particularly occurs when a semi-insulating substrate is employed. This effect especially results in problems in a high speed PLL frequency synthesizer operable at GHz frequencies.

SUMMARY OF THE INVENTION

An object of the present invention is to provide a semiconductor device including a frequency divider circuit in which phase modulation does not occur even using a semi-insulating substrate.

Other objects and advantages of the present invention will become apparent from the detailed description given hereinafter; it should be understood, however, that the detailed description and specific embodiment are given by way of illustration only, since various changes and modifications with in the spirit and scope of the invention will become apparent to those skilled in the art from this detailed description.

According to the present invention, a voltage higher than the lowest of the power supply voltages supplied to the frequency divider circuit is applied to the semi-insulating substrate on which a frequency divider circuit is disposed and, during operation of the circuit, the substrate voltage is made high. Thus, an electric field between an FET or resistor on the semi-insulating substrate and the substrate is reduced, thereby preventing oscillationss of the FET characteristics and resistance values, and the phase modulation of the output signal of the frequency divider circuit. Further, since the substrate voltages are increased during only the operation, any increase in the power consumption is suppressed.

BRIEF DESCRIPTION OF THE DRAWINGS

FIGS. 4(a) and 4(b) are a circuit diagram and an operational table of a third embodiment of the invention, respectively.

DETAILED DESCRIPTION OF THE PREFERRED EMBODIMENTS

An embodiment of the present invention will be described in detail with reference to the drawings.

Figure 1:
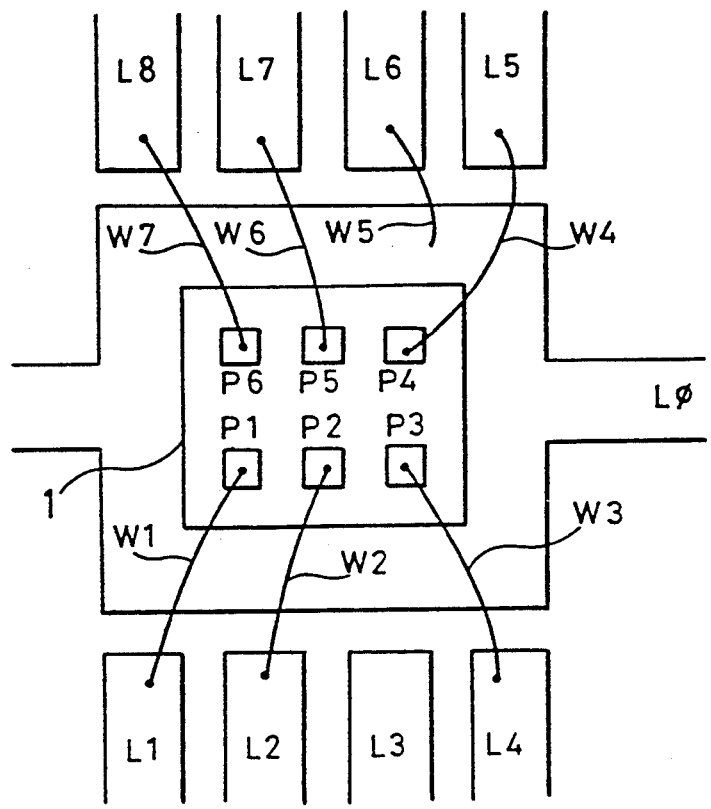
FIG. 1 is a diagram showing an arrangement of a package including a frequency divider circuit according to a first embodiment of the present invention.
Figure 2:
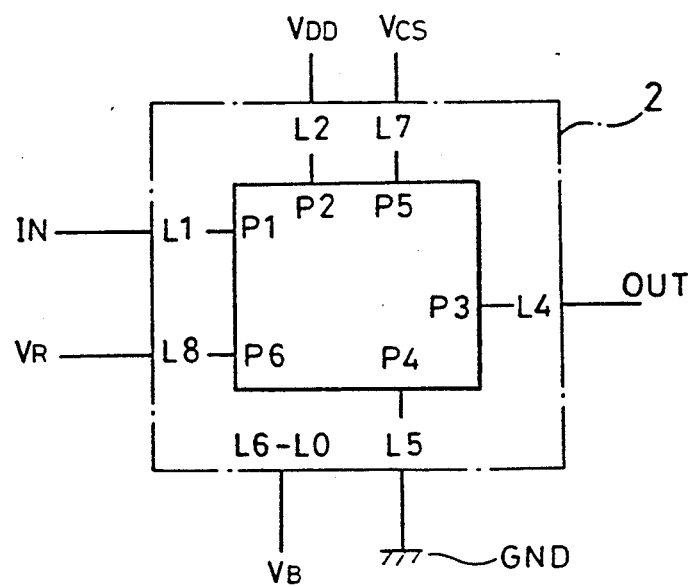
FIG. 2 is a circuit diagram of the package of FIG. 1

FIG. 1 shows a semiconductor device according to a first embodiment of the present invention. This figure shows an arrangement of a frequency divider circuit sealed in a package. FIG. 2 shows a circuit diagram thereof. In FIGS. 1 and 2, reference numeral 1 designates a semi-insulating substrate in which a frequency divider circuit is produced and reference numeral 2 designates the package. The circuit includes an input terminal P1 for inputting a signal to be frequency divided, a power supply terminal P2, a frequency divider output terminal P3, a ground terminal P4, a current control terminal P5, and a reference voltage input terminal P6. The substrate 1 is mounted on a frame L$\phi$ and the leads of package L1 are connected by W1 to W7 to respective terminals. Amongst them, the wire W5 connects the frame L$\phi$ and the lead L6. Further, IN in FIG. 2 represents an input signal to be frequency divided, $V_R$ a reference voltage, $V_{DD}$ a power supply voltage, $V_{CS}$ a current control signal, OUT an output signal, GND a ground voltage, and $V_B$ a substrate power supply voltage.

In this embodiment, the voltage applied to the semi-insulating substrate in which a frequency divider circuit is produced is higher than the lowest one of the power supply voltages supplied to the frequency divider circuit by the substrate power supply $V_B$. The substrate voltage is controlled so that a voltage independent of $V_{DD}$ and GND is applied to the frame on which the substrate is mounted. Therefore, when the voltage of the substrate power supply $V_B$ is a fairly high voltage which is close to the power supply voltage, the substrate voltage is made higher than that of the FET and the active layer of implantation resistance in the circuit. As a result, modulation of the thickness of the active layer does not arise.

The reason why an oscillation due to modulation of active layer arises when the substrate voltage is lower than the voltage of the channel, as described in the prior art, is as follows.

When the substrate voltage is low and the voltage of the channel is high, traps in the substrate capture electrons from the channel and substrate. When the traps are filled with electrons, electrons are emitted from the traps. Repetition of this capture and emission produces a voltage difference between the substrate and the channel, the depth of the depletion layer changes, and the thickness of the active layer varies. When the substrate voltage is raised as in the present invention, the electric field between the substrate and the channel is weakened and the influences of the traps are weakened, thereby removing the above-described oscillations. Thus, the output signal of the frequency divider circuit will not be phase-modulated and an accurate frequency divided output signal is obtained.

Figure 5:
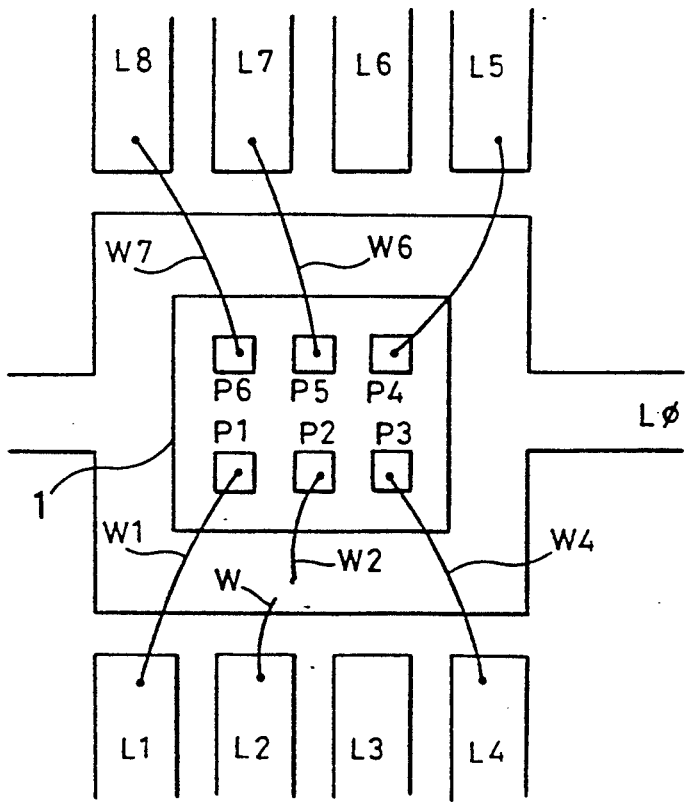
FIGS. 5 and 6 are a diagram of a package arrangement and a circuit diagram, respectively, of a second embodiment of the present invention.
Figure 6:
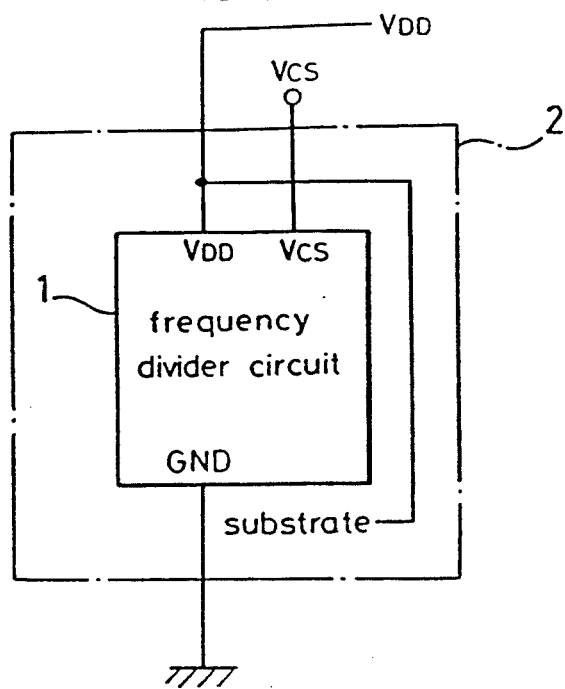

FIGS. 5 and 6 show a second embodiment of the present invention. In this second embodiment, the substrate power supply voltage $V_B$ is the power supply voltage $V_{DD}$. This power supply voltage $V_{DD}$ is connected to the frame L$\phi$ by a wire W.

In this second embodiment, because the substrate voltage $V_B$ is set at $V_{DD}$, modulation of the thickness of the active layer can be prevented and an accurate frequency division output is obtained as described in the first embodiment. Furthermore, it is not necessary to provide another power supply for the substrate voltage $V_B$ which simplifies circuit construction.

Figure 3:
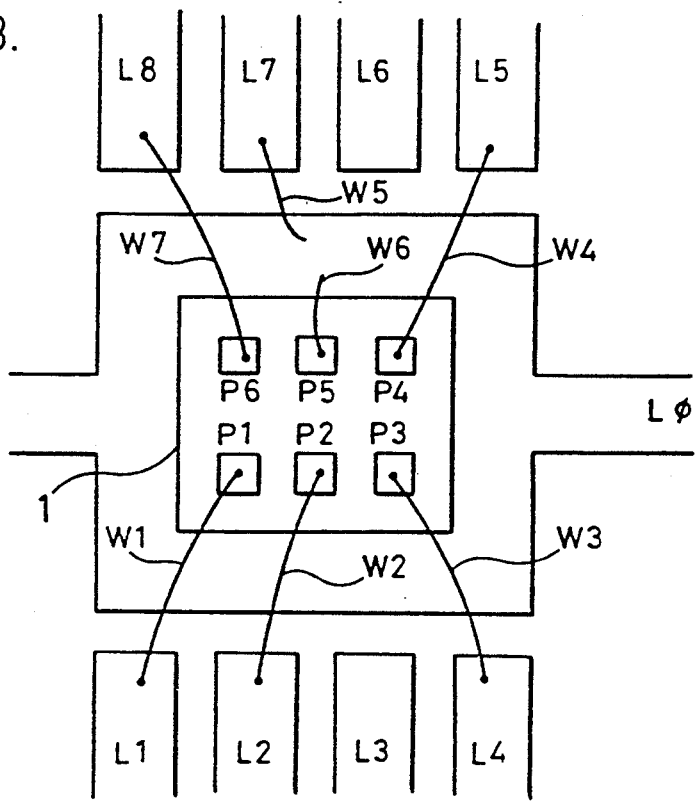
FIG. 3 is a diagram of a package arrangement according to a third embodiment of the present invention.

FIGS. 3 and 4(a) show a third embodiment of the present invention. In this third embodiment, the substrate voltage $V_B$ is set at the voltage of a current control terminal $V_{CS}$ for turning the frequency circuit ON or OFF. The current control terminal $V_{CS}$ is connected to the frame L$\phi$ by the wire W5.

In this third embodiment, because the substrate voltage $V_B$ is set at $V_{CS}$, the substrate voltage is close to $V_{DD}$ in the operation of the frequency divider circuit and is close to ground when the frequency divider circuit is halted. Therefore, during operation modulation of the thickness of the active layer can be prevented, thereby obtaining an accurate frequency divided output signal.

Furthermore, when the frequency divider circuit is halted, it is quite natural that the current flowing through the frequency divider circuit is reduced, that the substrate voltage is made ground, and that the FET and the active layer 1a of the implantation resistor are made thin by the depletion layer extending from the interface with the substrate 1. Thus, leakage current does not flow, and the power supply current of frequency divider circuit can be reduced to a great extent.

In the above-described first, second, and third embodiments, as a method of applying a voltage to the substrate, respective power supply terminals are connected to the frame of package by wire bonding, and the voltages are applied to the substrate from its rear surface. However, this may also be achieved by another other method.

Figure 7:
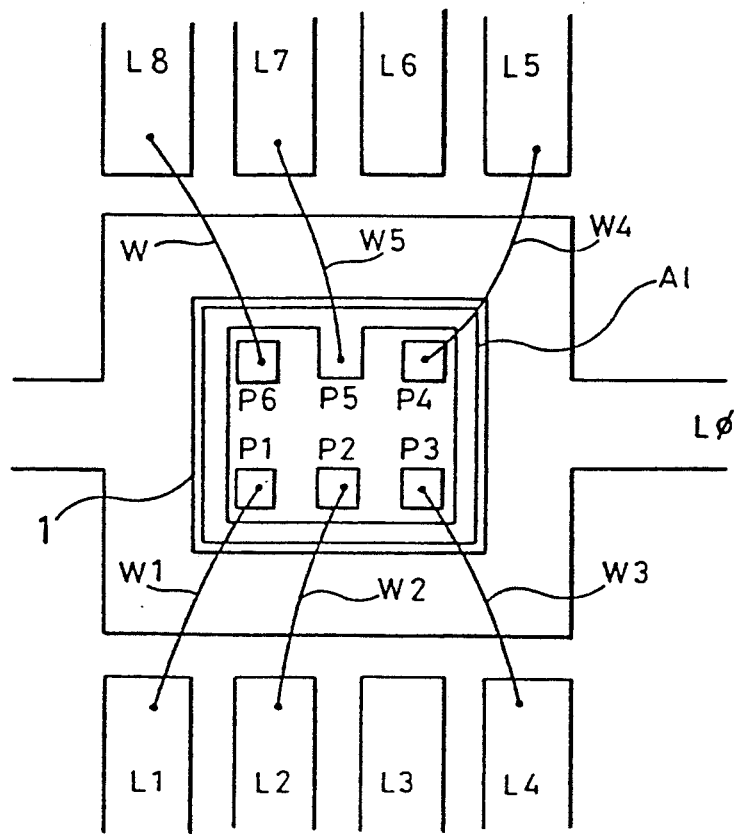
FIG. 7 is a diagram of a package arrangement according to a fourth embodiment of the invention.

FIG. 7 shows a fourth embodiment of the present invention. In this embodiment, an Al electrode pattern of $V_{CS}$ electrode is produced in a contour configuration at the upper surface of semi-insulating substrate 1, and whereby the $V_{CS}$ voltage is given to the substrate from the upper surface of substrate.

Figure 8:
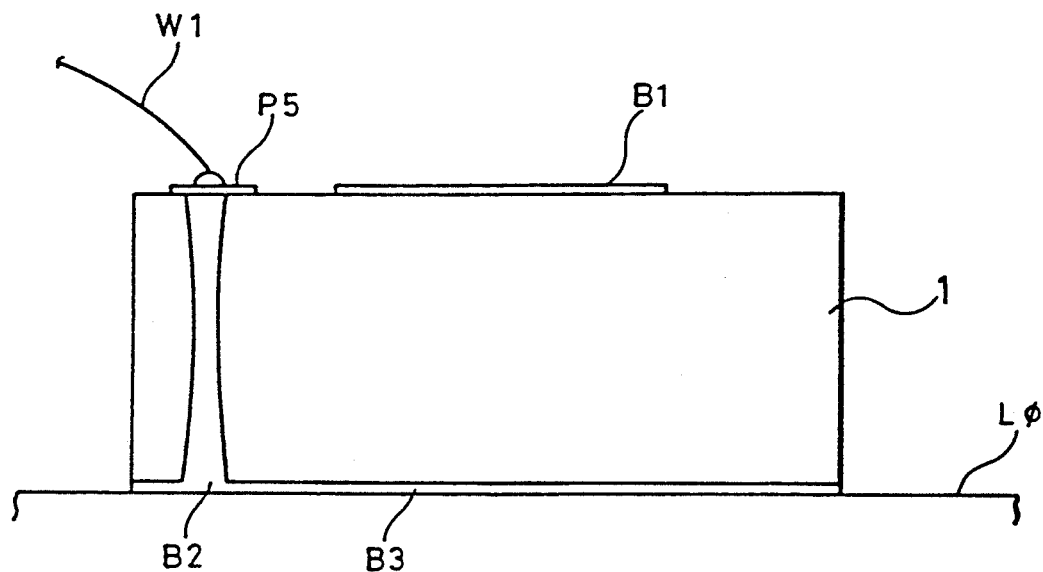
FIGS. 8 and 9 are side views of fifth and sixth embodiments of the present invention, respectively.

FIG. 8 shows a fifth embodiment of the present invention. In this fifth embodiment, a via-hole aperture penetrates from the front surface of substrate to the rear surface so that the $V_{CS}$ voltage may be applied to the substrate from the rear surface B3.

In more detail, in the device of FIG. 8, there are provided a bonding wire W1, a circuit pattern B1, and a via-hole aperture B2 which penetrates the substrate from the front surface to the rear surface. This via-hole aperture B2 is produced by dry etching from the front surface of substrate to the rear surface thereof. Reference character B3 designates a rear surface electrode.

Figure 9:
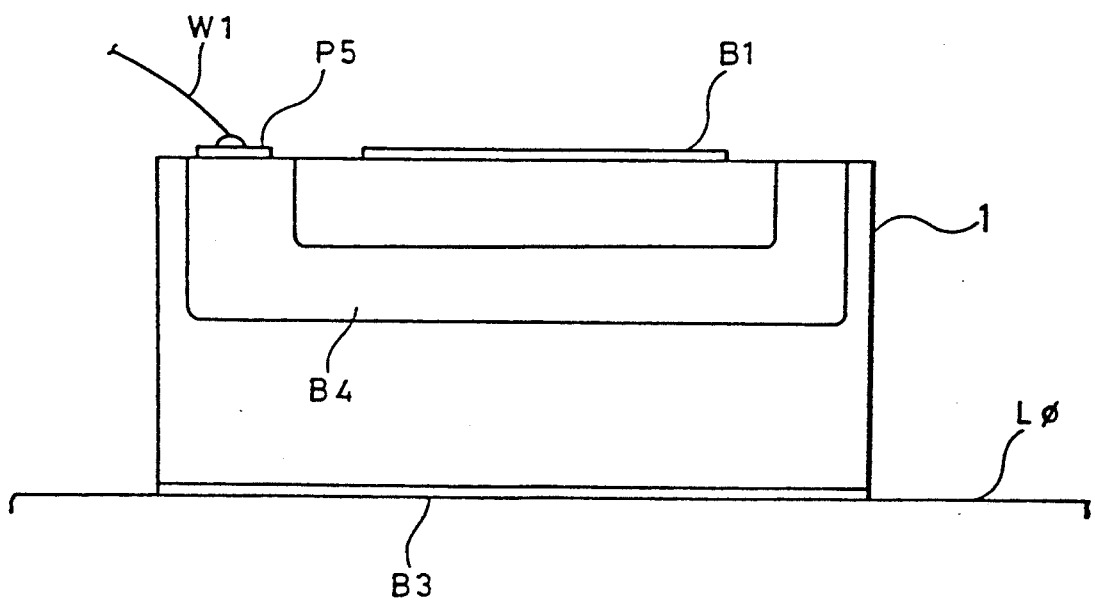
Figure 10:
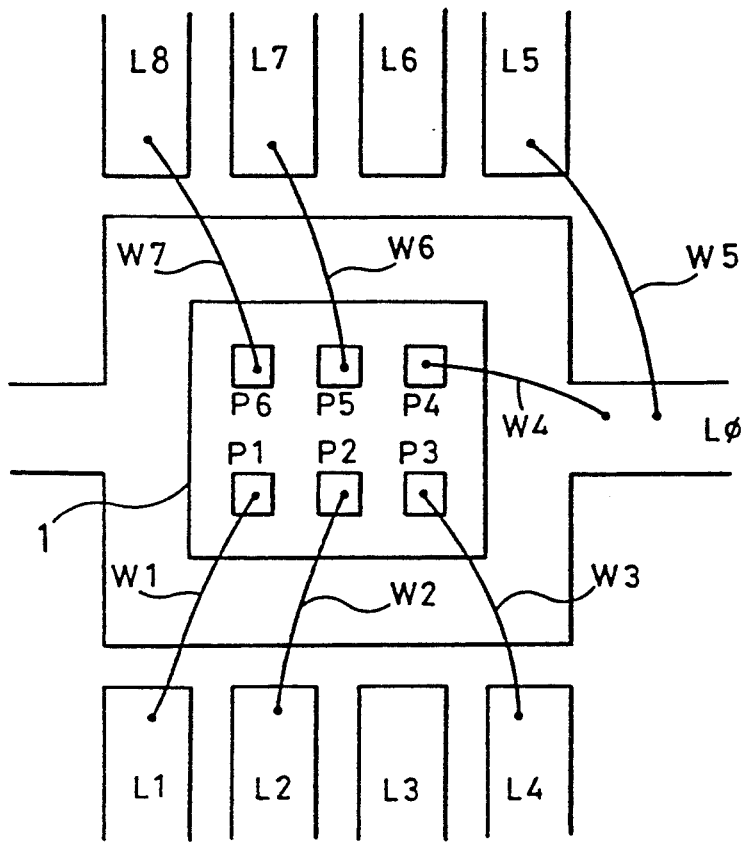
FIG. 10 is a diagram showing an arrangement of package of a frequency divider circuit according to the prior art.
Figure 11:
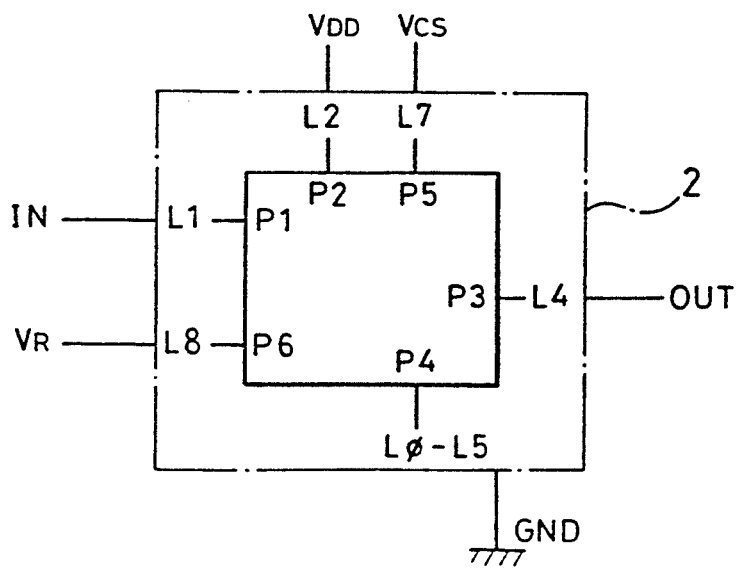
FIG. 11 is a circuit diagram of the package of FIG. 10.
Figure 12:
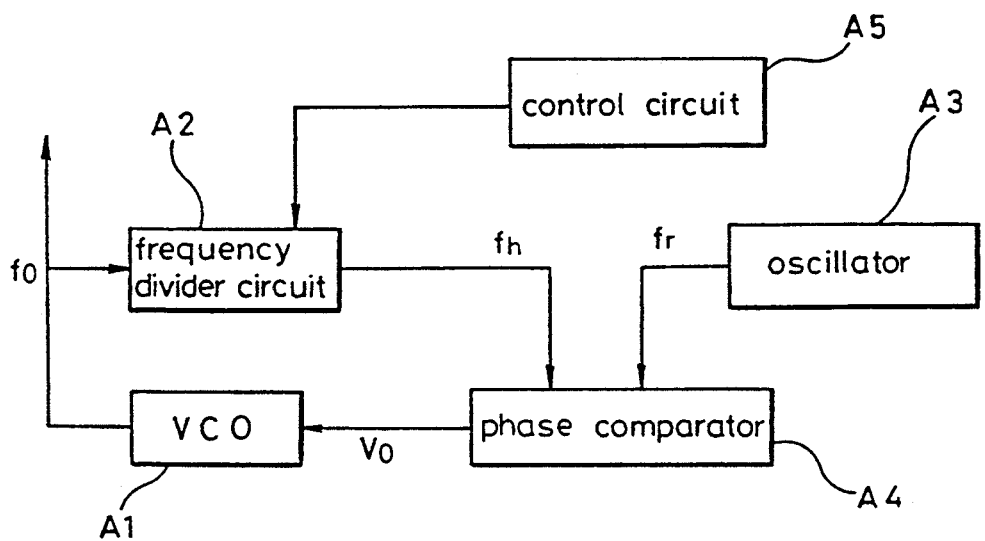
FIG. 12 is a diagram showing a PLL frequency synthesizer including a frequency divider circuit.
Figures 13A, 13B:
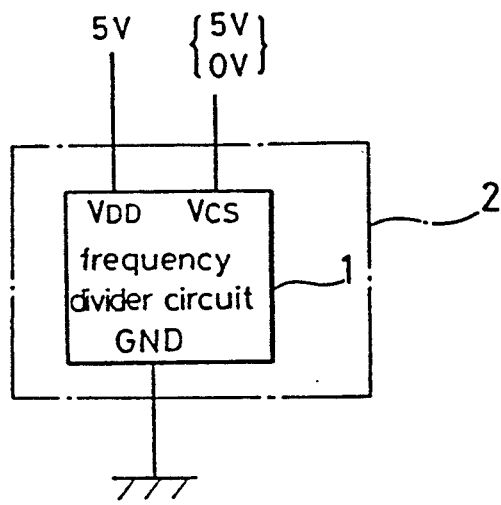
FIG. 13(a) is a circuit diagram of a frequency divider circuit incorporating a halt mode and FIG. 13(b) is an operational table of the circuit.
Figure 14:
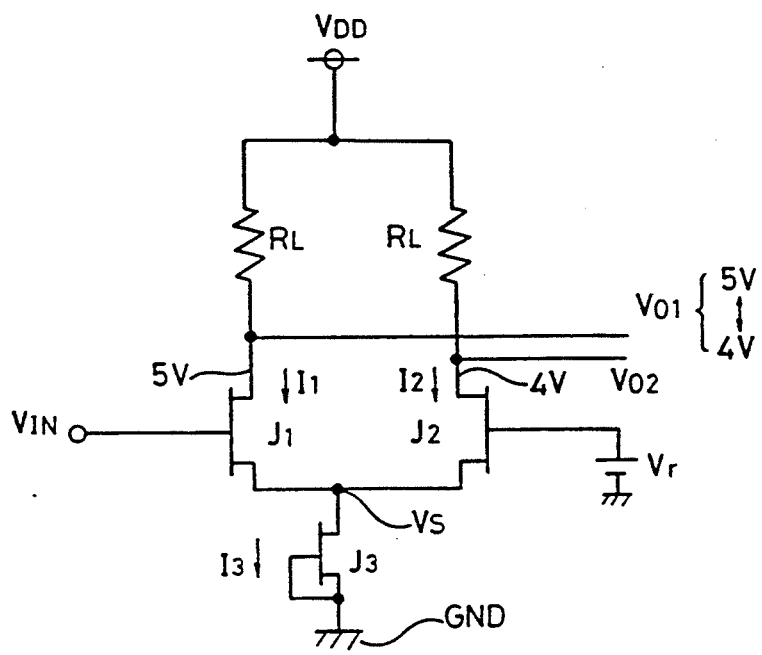
FIG. 14 is a circuit diagram of a logic gate in a frequency divider circuit.
Figure 15:
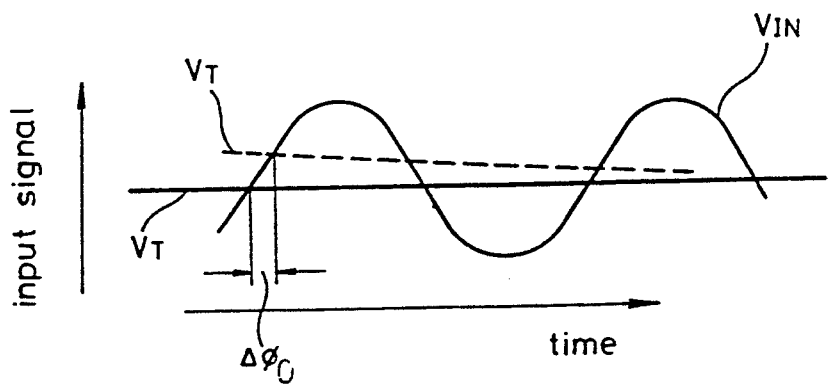
FIG. 15 is graph showing the phase error caused by the frequency divider circuit.
Figure 16:
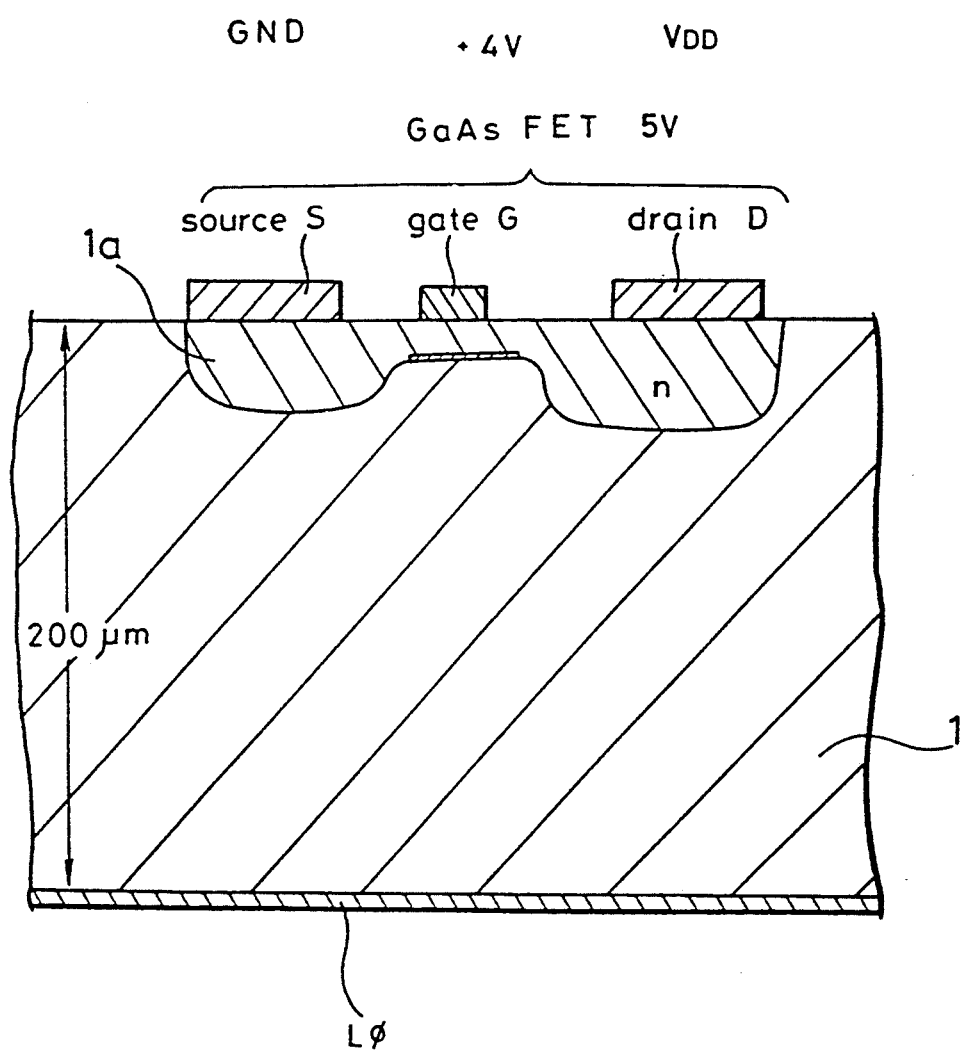
FIG. 16 is a cross-sectional view of a field effect transistor of a frequency divider circuit.

FIG. 9 shows a sixth embodiment of the present invention. In this sixth embodiment, a conductive layer B4 is disposed in the semi-insulating substrate, and a voltage is applied to this conductive layer from the front surface of the substrate.

In more detail, in the device of FIG. 9, a conductive layer B4 is disposed in the substrate 1, and the $V_{CS}$ voltage is applied to this conductive layer B4 from the terminal P5. When the $V_{CS}$ voltage is applied by the conductive layer B4 to the substrate 1 on which a circuit pattern B1 is produced, similar effects to those described above are obtained.

In the above-illustrated embodiments of FIGS. 7, 8, and 9, the $V_{CS}$ voltage is applied to the substrate. However, another power supply voltage which makes the substrate voltage high may be applied to the substrate with the same effects as described above.

As is evident from the foregoing description, according to the present invention, a semi-insulating substrate in which a frequency divider circuit is produced is made a higher voltage than that of the active layer of the circuit element. Therefore, there is no oscillation of circuit element and no phase modulation in the output signal of frequency divider circuit. Accordingly, an accurate output signal is obtained.

What is claimed is:

1. A frequency divider for dividing the frequency of an input signal to produce an output signal of lower frequency than the input signal comprising a frequency divider circuit formed in a semi-insulating GaAs substrate and including a field effect transistor having an active layer in the semi-insulating GaAs substrate, the frequency divider circuit having a power supply terminal for supplying power to the frequency divider circuit, a ground terminal, and a control terminal for applying a control signal to activate and deactivate frequency division by the frequency divider circuit wherein the power supply terminal is directly electrically connected to the semi-insulating GaAs substrate whereby changes in substrate potential do not modulate the active layer, thereby avoiding phase shifting of the output signal.

2. The frequency divider of claim 1 wherein the substrate has opposed first and second surfaces, the field effect transistor is disposed at the first surface of the substrate, and the power supply terminal is connected to the substrate at the first surface.

3. The frequency divider of claim 1 wherein the substrate includes an electrically conducting via hole penetrating through the substrate from the first surface to the second surface, the field effect transistor is disposed at the first surface, and the power supply terminal is connected to the substrate at the front surface and through the via hole to the rear surface.

4. A frequency divider for dividing the frequency of an input signal to produce an output signal of lower frequency than the input signal comprising a frequency divider circuit formed in a semi-insulating GaAs substrate and including a field effect transistor having an active layer in the semi-insulating GaAs substrate, the frequency divider circuit having a power supply terminal for supplying power to the frequency divider circuit, a ground terminal, and a control terminal for applying a control signal to activate and deactivate frequency division by the frequency divider circuit wherein the control terminal is directly electrically connected to the semi-insulating GaAs substrate whereby changes in substrate potential do not modulate the active layer, thereby avoiding phase shifting of the output signal.

* * * * *